US012716962B2

(12) United States Patent
Kim et al.

(10) Patent No.: US 12,716,962 B2
(45) Date of Patent: Aug. 25, 2026

(54) METHOD FOR MEASURING DC BIAS AGING CHARACTERISTICS OF MULTILAYER CAPACITOR

(71) Applicant: SAMSUNG ELECTRO-MECHANICS CO., LTD., Suwon-si (KR)

(72) Inventors: Dong Seuk Kim, Suwon-si (KR); Geon Yong Lee, Suwon-si (KR); Myung Duk Seo, Suwon-si (KR); Dong Hwi Shin, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 226 days.

(21) Appl. No.: 18/597,169

(22) Filed: Mar. 6, 2024

(65) Prior Publication Data

US 2025/0044375 A1 Feb. 6, 2025

(30) Foreign Application Priority Data

Aug. 4, 2023 (KR) ........................ 10-2023-0102170

(51) Int. Cl.

| | |
|---|---|
| ***G01R 31/64*** | (2020.01) |
| ***H01G 4/012*** | (2006.01) |
| ***H01G 4/12*** | (2006.01) |
| ***H01G 4/30*** | (2006.01) |

(52) U.S. Cl.

CPC ............. *G01R 31/64* (2020.01); *H01G 4/012* (2013.01); *H01G 4/1227* (2013.01); *H01G 4/30* (2013.01)

(58) Field of Classification Search

CPC ........ G01R 31/64; H01G 4/012; H01G 4/122; H01G 4/30

See application file for complete search history.

(56) References Cited

U.S. PATENT DOCUMENTS

| | | | | |
|---|---|---|---|---|
| 2004/0120098 A1* | 6/2004 | Yamazaki | H01G 2/20 | 361/301.5 |
| 2005/0068711 A1* | 3/2005 | Ito | H01G 4/30 | 361/271 |
| 2014/0114592 A1* | 4/2014 | Eilertsen | G01R 31/64 | 702/58 |
| 2017/0152187 A1* | 6/2017 | Nagaoka | C01G 23/006 | |
| 2020/0241065 A1* | 7/2020 | Davis | G01R 1/30 | |

FOREIGN PATENT DOCUMENTS

| | | |
|---|---|---|
| JP | 2000-340474 A | 12/2000 |
| JP | 2002-014129 A | 1/2002 |

* cited by examiner

*Primary Examiner* — Stephanie E Bloss
*Assistant Examiner* — Michael A Harrison
(74) *Attorney, Agent, or Firm* — Morgan Lewis & Bockius LLP

(57) ABSTRACT

A method for measuring DC bias aging characteristics of a multilayer capacitor includes applying a first poling voltage to a multilayer capacitor including a body having a dielectric layer including a plurality of dielectric grains and an internal electrode disposed alternately with the dielectric layer in a first direction, and an external electrode disposed on the body, maintaining the first poling voltage for a first period of time (t1), applying a DC bias voltage lower than the first poling voltage, maintaining the DC bias voltage for a second period of time (t2), and measuring saturated capacitance after the DC bias voltage is applied.

19 Claims, 20 Drawing Sheets

METHOD FOR MEASURING DC BIAS AGING CHARACTERISTICS OF MULTILAYER CAPACITOR

CROSS-REFERENCE TO RELATED APPLICATION(S)

This application claims benefit of priority to Korean Patent Application No. 10-2023-0102170 filed on Aug. 4, 2023 in the Korean Intellectual Property Office, the disclosure of which is incorporated herein by reference in its entirety.

TECHNICAL FIELD

The present disclosure relates to a method for measuring DC bias aging characteristics of a multilayer capacitor.

Multilayer capacitors have been widely used as components for electronic devices such as computers and mobile phones due to having a small size, ensuring high capacitance and being easily mounted, and also have been widely used as components for electrical devices (including vehicles) due to high reliability and high strength characteristics thereof.

As such, due to the diversity of electronic/electrical devices in which multilayer capacitors are used, multilayer capacitors may be evaluated by many assurance indicators such as capacitance characteristics, temperature characteristics, and operating voltage characteristics.

A multilayer capacitor may be used for a long period of time (for example, 10 or more years). Accordingly, among the many assurance indicators, DC bias aging characteristics may be an indicator of a minimum capacitance value. Thus, a period of time required to measure DC bias aging characteristics may be relatively increased as compared to other assurance indicators. When the required period of time is excessively reduced, the accuracy of measuring DC bias aging characteristics may be lowered.

SUMMARY

An aspect of the present disclosure is to rapidly and accurately measure DC bias aging characteristics of a multilayer capacitor.

Another aspect of the present disclosure is to accurately predict saturated capacitance caused by DC bias aging of a multilayer capacitor at different temperatures.

According to an aspect of the present disclosure, there is provided a method for measuring DC bias aging characteristics of a multilayer capacitor, the method including applying a first poling voltage to the multilayer capacitor including a body having a dielectric layer including a plurality of dielectric grains and an internal electrode disposed alternately with the dielectric layer in a first direction, and an external electrode disposed on the body, maintaining the first poling voltage for a first period of time (t1), applying a DC bias voltage lower than the first poling voltage, maintaining the DC bias voltage for a second period of time (t2), and measuring saturated capacitance after the DC bias voltage is applied.

According to another aspect of the present disclosure, there is provided a method for measuring DC bias aging characteristics of a multilayer capacitor, the method including applying a first poling voltage to the multilayer capacitor including a body having a capacitance region in which at least one first internal electrode and at least one second internal electrode are alternately stacked in a first direction with at least one dielectric layer interposed therebetween, and first and second external electrodes disposed on the body to be spaced apart from each other, the first and second external electrodes respectively connected to the at least one first internal electrode and the at least one second internal electrode, measuring a first capacitance of the multilayer capacitor to which a DC bias voltage, lower than the first poling voltage, is applied after the first poling voltage is applied, applying a second poling voltage, different from the first poling voltage, to the multilayer capacitor, measuring a second capacitance of the multilayer capacitor to which the DC bias voltage, lower than the second poling voltage, is applied after the second poling voltage is applied, and determining, based on the first and second poling voltages and the first and second capacitances, DC bias aging characteristics of the multilayer capacitor.

According to another aspect of the present disclosure, there is provided a method for measuring DC bias aging characteristics of a multilayer capacitor including a body having a dielectric layer including a plurality of dielectric grains and an internal electrode disposed alternately with the dielectric layer, the method including: repeatedly performing a series of operations below two or more times, each time with a different poling voltage: applying the poling voltage to the multilayer capacitor so as to polarize the dielectric layer, applying a DC bias voltage to the multilayer capacitor to depolarize the polarized dielectric layer, and measuring saturated capacitance of the multilayer capacitor, after depolarizing the dielectric layer; and predicting saturated capacitance after aging of the multilayer capacitor, using the measured capacitances and an exponential decay function.

A method for measuring DC bias aging characteristics of a multilayer capacitor according to example embodiments of the present disclosure may rapidly and accurately measure the DC bias aging characteristics of the multilayer capacitor, and may rapidly and accurately provide an assurance indicator of a minimum capacitance value of the multilayer capacitor.

The method may rapidly predict saturated capacitance due to DC bias aging of the multilayer capacitor at different temperatures.

The method according to example embodiments of the present disclosure may reduce an existing measurement period of time required for at least 100 hours to 1 hour or less, thereby not only reducing spatial and tangible costs required to expand facilities for measurement, but also achieving an intangible result, such as a reduction in product development time.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
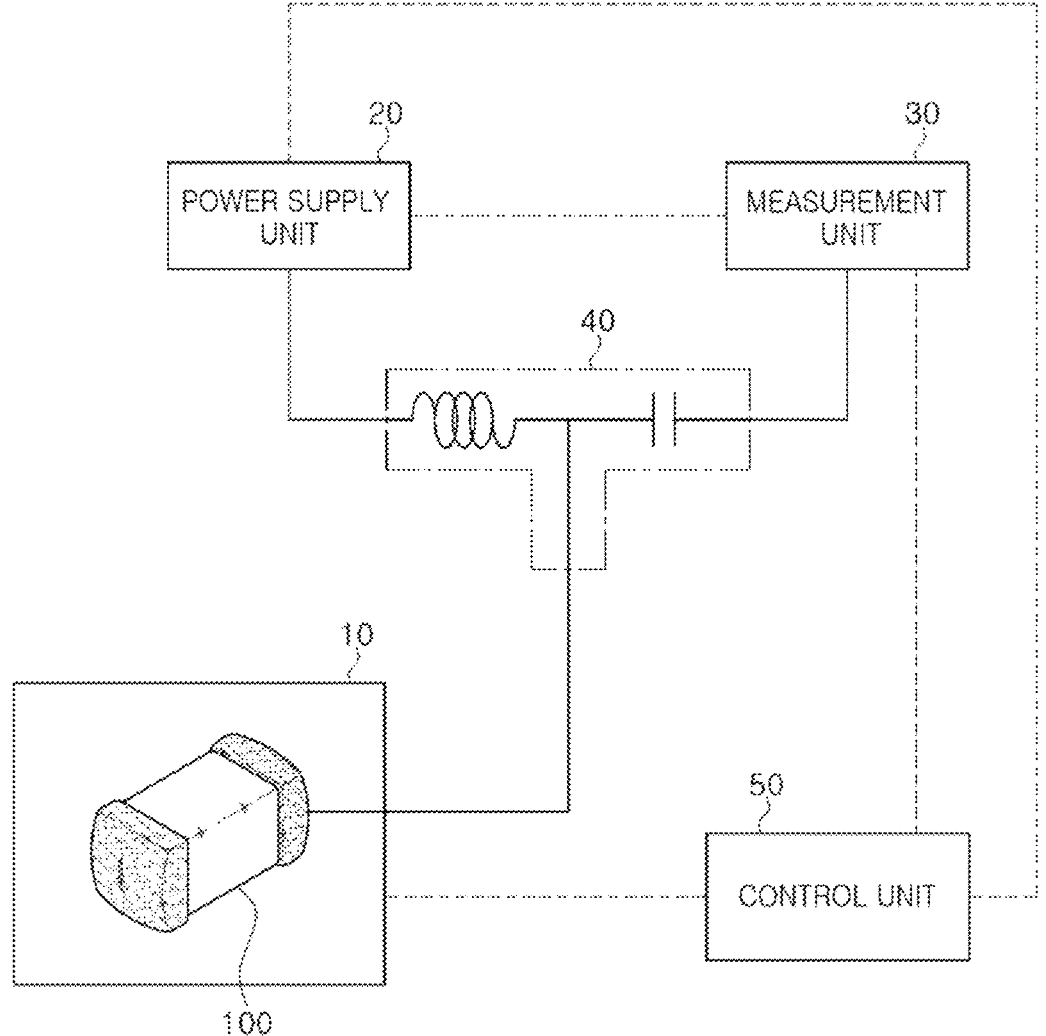
FIG. 1 is a diagram illustrating a system for executing a method for measuring DC bias aging characteristics of a multilayer capacitor according to an example embodiment of the present disclosure.

Hereinafter, example embodiments of the present disclosure are described with reference to the accompanying drawings. The present disclosure may, however, be exemplified in many different forms and should not be construed as being limited to the specific example embodiments set forth herein. In addition, example embodiments of the present disclosure may be provided for a more complete description of the present disclosure to those skilled in the art. Accordingly, the shapes and sizes of the elements in the drawings may be exaggerated for clarity of description, and elements denoted by the same reference numerals in the drawings may be the same elements.

In order to clearly illustrate the present disclosure, portions not related to the description are omitted, and sizes and thicknesses are magnified in order to clearly represent layers and regions, and similar portions having the same functions within the same scope are denoted by similar reference numerals throughout the specification.

Throughout the specification, when an element is referred to as “comprising” or “including,” it means that it may include other elements as well, rather than excluding other elements, unless specifically stated otherwise.

A direction of a hexahedron may be defined to clearly illustrate example embodiments of the present disclosure. First to third directions illustrated in the drawings may refer to a thickness direction, a length direction, and a width direction, respectively. Here, the thickness direction may be used interchangeably with a stacking direction (or a first direction) in which a dielectric layer is stacked.

Hereinafter, a multilayer capacitor according to an example embodiment of the present disclosure will be described. In particular, a multilayer ceramic capacitor (MLCC) will be described, but the present disclosure is not limited thereto.

Method for Measuring DC Bias Aging Characteristics of Multilayer Capacitor

In the present specification, DC bias aging characteristics of a multilayer capacitor may be one of reliability assurance indicators of a multilayer capacitor 100, and may refer to a minimum capacitance value after the multilayer capacitor 100 is used for a long period of time (for example, 10 or more years) under an operating condition in which a specific DC bias voltage is applied at various temperatures.

According to the related art, in order to measure the DC bias aging characteristics of the above-described multilayer capacitor, a DC bias voltage was applied to the multilayer capacitor for a considerable period of time (for example, 100 to 3000 hours) to measure a finally saturated capacitance. In the present example embodiment, the DC bias aging characteristics of the above-described multilayer capacitor may be measured in a short period of time while obtaining high accuracy close to a measured value according to the related art.

Hereinafter, a system and a measurement method used to measure DC bias aging characteristics of a multilayer capacitor according to the present example embodiment will be described in detail.

FIG. 1 is a diagram illustrating a system for executing a method for measuring DC bias aging characteristics of a multilayer capacitor according to an example embodiment of the present disclosure.

Referring to FIG. 1, a system for executing a method for measuring DC bias aging characteristics of a multilayer capacitor according to the present example embodiment may include at least some components, among a temperature control unit 10 accommodating the multilayer capacitor 100, a measurement target, a power supply unit 20 supplying power to the system, a measurement unit 30 measuring capacitance of the multilayer capacitor 100, and a bias tee 40 applying, based on power supplied from the power supply unit 20, a DC voltage to the multilayer capacitor 100, the bias tee 400 circuitously separated to prevent interference with measurement of the measurement unit 30.

The temperature control unit 10 may be configured to control a temperature of an internal space in which the multilayer capacitor 100 is accommodated such that the temperature falls within a predetermined temperature range all the time, and to adjust the temperature. The temperature may be less than or equal to a Curie temperature of a dielectric layer of the multilayer capacitor 100.

The power supply unit 20 may include a DC power supply. Alternatively, the power supply unit 20 may include a converter for converting an AC voltage to a DC voltage or changing the DC voltage. For example, the DC voltage applied to the multilayer capacitor 100 may be changed by the power supply unit 20.

The bias tee 40 may control a DC voltage applied between first and second external electrodes of the multilayer capacitor 100 such that the DC voltage is maintained to be equal to a target DC voltage.

For example, the measurement unit 30 may apply an AC signal to the multilayer capacitor 100 to measure capacitance of the multilayer capacitor 100, and the bias tee 40 may be configured to prevent interference between the AC signal and the DC voltage. Therefore, DC voltage application and capacitance measurement may be simultaneously performed. For example, a DC block capacitor may be connected in series between the bias tee 40 and the measurement unit 30, and the bias tee 40 may include a low-pass filter, a high-pass filter, or a switch.

The control unit (or a controller) 50 may control each of the temperature control unit 10, the power supply unit 20, and the measurement unit 30, and may record measured data. In addition, the control unit 50 may calculate, based on the recorded data, a predicted value for saturated capacitance of the multilayer capacitor 100, but the present disclosure is not limited thereto.

Figure 2:
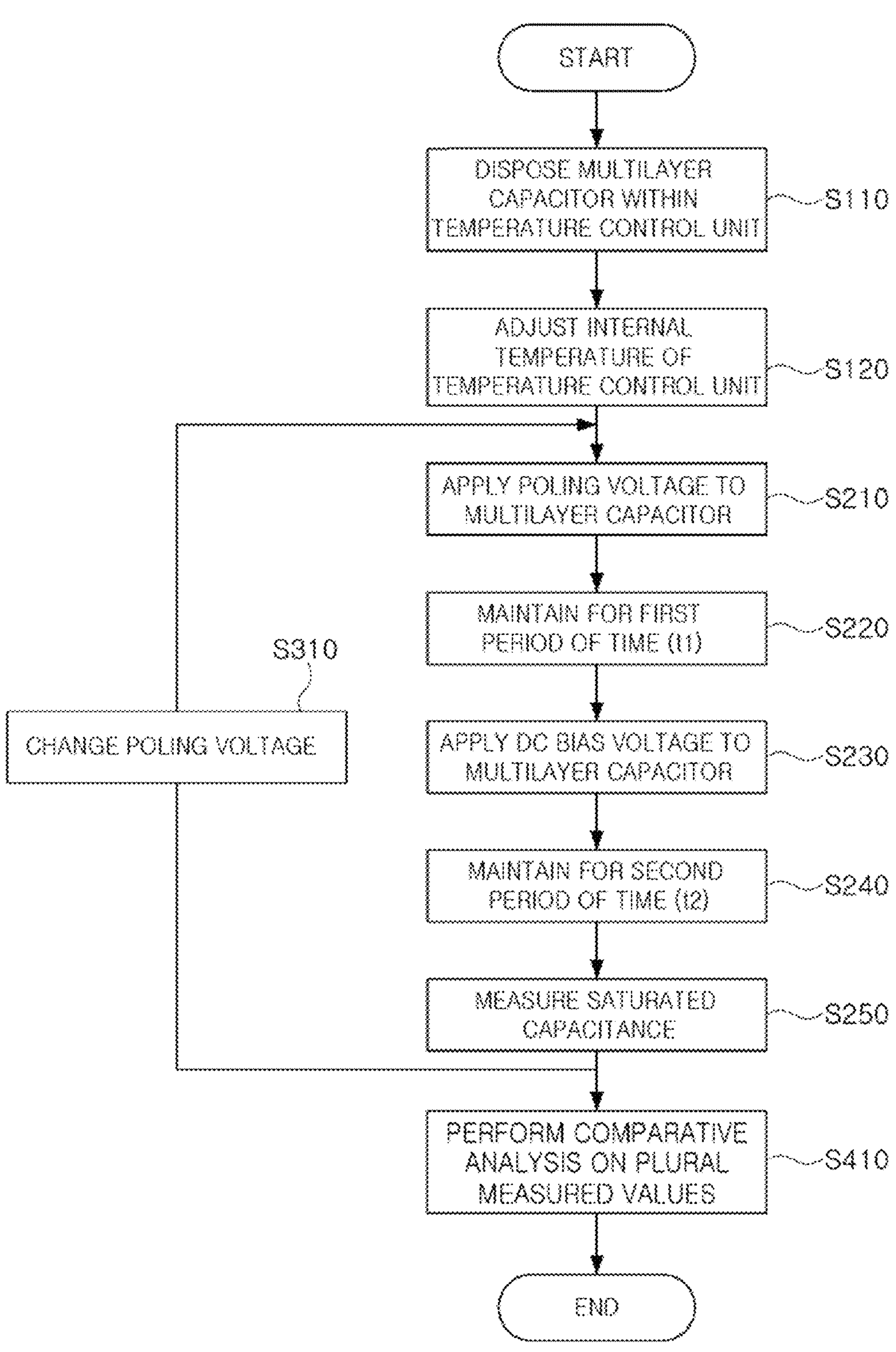
FIG. 2 is a flowchart illustrating a method for measuring DC bias aging characteristics of a multilayer capacitor according to an example embodiment of the present disclosure.

FIG. 2 is a flowchart illustrating a method for measuring DC bias aging characteristics of a multilayer capacitor according to an example embodiment of the present disclosure.

Referring to FIG. 2, a multilayer capacitor 100, a measurement target, according to the present example embodiment, may be disposed within a temperature control unit 10 (S110), and an interior of the temperature control unit 10 may be maintained at a specific temperature (S120). The interior of the temperature control unit 10 may be set and maintained at a specific temperature based on a control signal from the control unit 50.

Here, the temperature of the temperature control unit 10 may be a temperature less than or equal to a Curie temperature (Tc) of a dielectric layer 111 of the multilayer capacitor 100, a measurement target. For example, in the present example embodiment, the temperature of the temperature control unit 10 may be less than 180° C., and may be preferably a specific temperature within a range of 25° C. to 125° C., but the present disclosure is not limited thereto.

Subsequently, a poling voltage may be applied to the multilayer capacitor 100 using the power supply unit 20 and the bias tee 40 (S210). The control unit 50 may be configured to control the power supply unit 20 to adjust the poling voltage applied to the multilayer capacitor 100 through the bias tee 40.

Here, the poling voltage may be a voltage capable of polarizing a dielectric of the multilayer capacitor 100, and may be a voltage at a level at which domains is aligned in a direction and a domain wall DW is expanded.

The poling voltage may be a voltage, lower than a breakdown voltage. For example, the poling voltage may be a voltage of 70% or less of a breakdown voltage of the multilayer capacitor 100, a measurement target, and may be 30 V or more and 70 V or less, but the present disclosure is not limited thereto.

Subsequently, the poling voltage applied to the multilayer capacitor 100 may be maintained for a first period of time (t1) (S220).

The first period of time (t1) may be a period of time sufficient for polarization to occur in the dielectric layer 111 of the multilayer capacitor 100, and may be a period of time of 1 minute or more. However, when the first period of time (t1) is increased, it may be advantageous in terms of accuracy in measuring DC bias aging characteristics of a multilayer capacitor. The first period of time (t1) may be preferably 20 minutes, but the present disclosure is not limited thereto.

Subsequently, a DC bias voltage may be applied to the multilayer capacitor 100 using the power supply unit 20 and the bias tee 40 (S230). The control unit 50 may be configured to control the power supply unit 20 to adjust the DC bias voltage applied to the multilayer capacitor 100 through the bias tee 40.

The DC bias voltage applied to the multilayer capacitor 100 may be a voltage similar to the DC bias voltage applied when the multilayer capacitor 100 is surface-mounted on a PCB board and used, and may be lower than a first poling voltage.

For example, the DC bias voltage may be 1.8 V or 3.3 V, but the present disclosure is not limited thereto.

Subsequently, the DC bias voltage applied to the multilayer capacitor 100 may be maintained for a second period of time (t2) (S240).

The second period of time (t2) may be a period of time sufficient for depolarization to occur in the dielectric layer 111 of the multilayer capacitor 100, and may be a period of time of 1 minute or more. However, when the second period of time (t2) is increased, it may be advantageous in terms of accuracy in measuring DC bias aging characteristics of a multilayer capacitor. The second period of time (t2) may be preferably 20 minutes, but the present disclosure is not limited thereto.

Subsequently, saturated capacitance of the multilayer capacitor 100, a measurement target, may be measured using a measurement unit 30 and a control unit 50 (S250).

The method for measuring DC bias aging characteristics of a multilayer capacitor according to the present example embodiment may include applying a poling voltage as a first operation. Accordingly, saturated capacitance may be measured in a much shorter period of time, as compared to a case of measuring capacitance by immediately applying a DC bias voltage.

Subsequently, a changed poling voltage may be applied to the multilayer capacitor 100 using the control unit 50, the power supply unit 20, and the bias tee 40 (S310).

For example, when a poling voltage first applied to the multilayer capacitor 100 is referred to as a first poling voltage, and a poling voltage re-applied after operation S310 is referred to as a second poling voltage, the first poling voltage and the second poling voltage may have a voltage difference of 10V.

In addition, the first poling voltage and the second poling voltage may be selected within a range of 30 V or more and 70 V or less, respectively, but the present disclosure is not limited thereto.

The above-described operations may be repeatedly performed, thereby obtaining a plurality of saturated capacitance measured values for various poling voltages.

Subsequently, the saturated capacitance of the multilayer capacitor after DC bias aging may be predicted using comparative analysis of the plurality of saturated capacitance measured values for the various poling voltages and an exponential decay function (S410).

Detailed experimental data and error results thereof will be described below.

Figure 3:
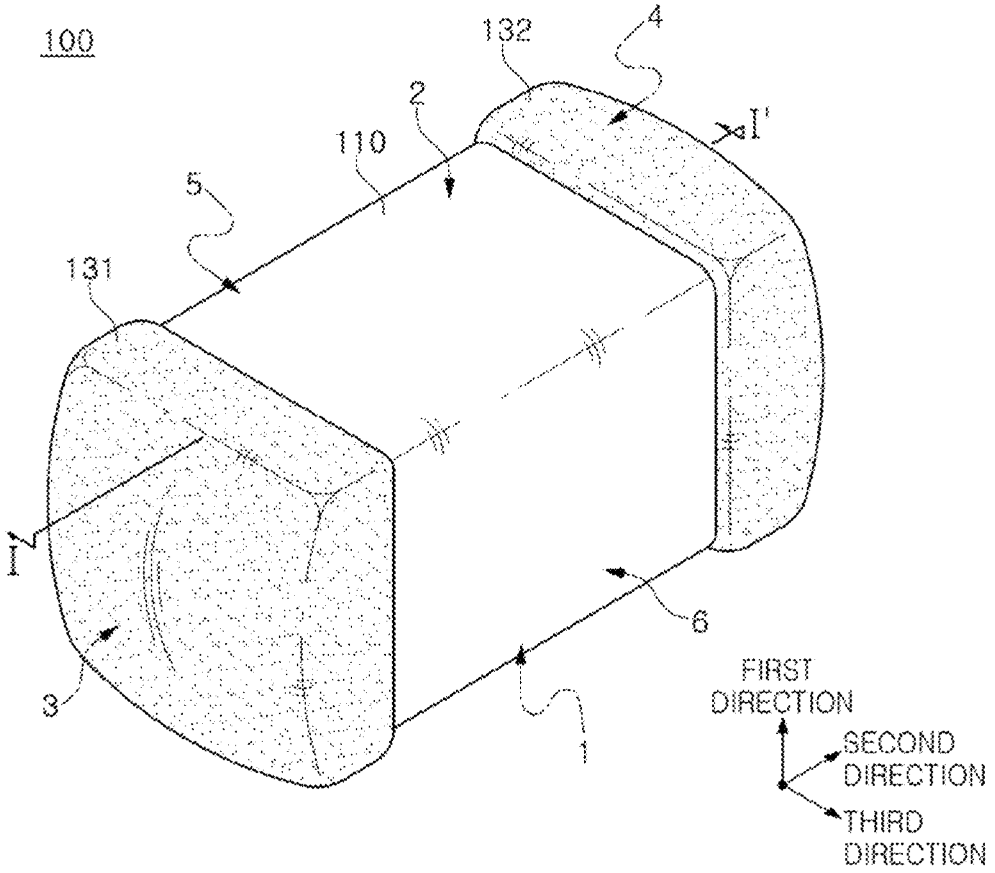
FIG. 3 is a schematic perspective view illustrating a multilayer capacitor, a measurement target, in a method for measuring DC bias aging characteristics of a multilayer capacitor according to an example embodiment of the present disclosure.
Figure 4:
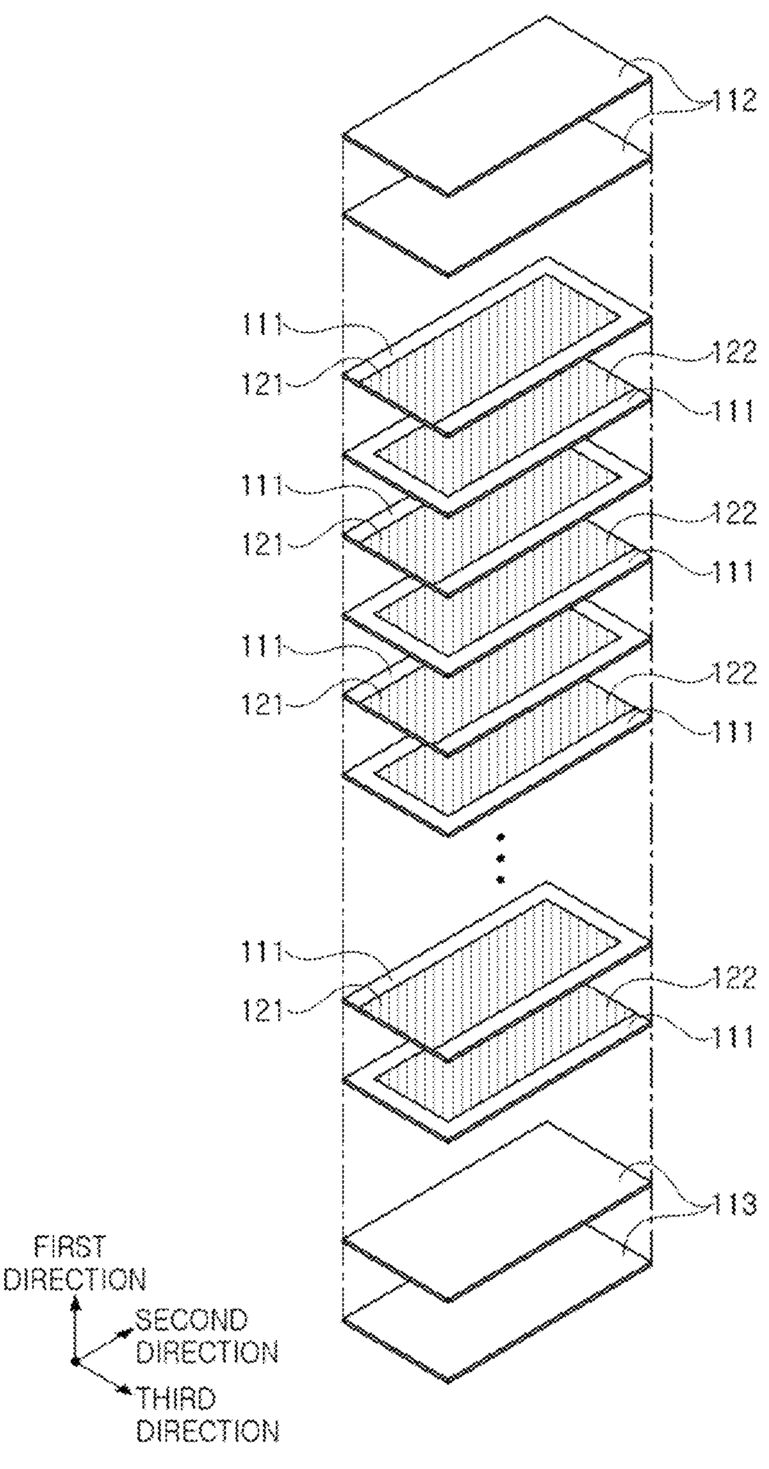
FIG. 4 is an exploded perspective view illustrating a multilayer structure of internal electrodes.
Figure 5:
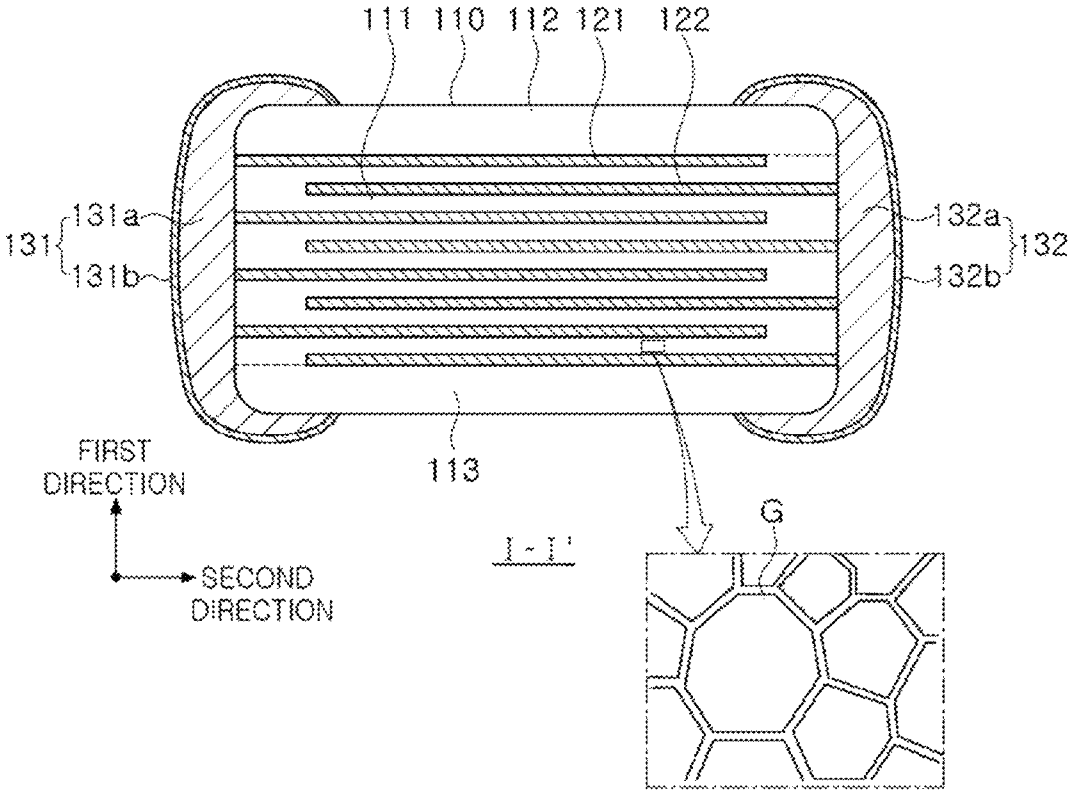
FIG. 5 is a cross-sectional view taken along line I-I' of FIG. 3 and a partially enlarged view.

Multilayer Capacitor, Measurement Target, According to Present Example Embodiment FIG. 3 is a schematic perspective view illustrating a multilayer capacitor, a measurement target, in a method for measuring DC bias aging characteristics of a multilayer capacitor according to an example embodiment of the present disclosure. FIG. 4 is an exploded perspective view illustrating a multilayer structure of internal electrodes. FIG. 5 is a cross-sectional view taken along line I-I' of FIG. 3 and a partially enlarged view.

Referring to FIGS. 3 to 5, a multilayer capacitor 100, a measurement target, may include a body 110 including a dielectric layer 111 including a plurality of dielectric grains G and internal electrodes 121 and 122 disposed alternately with the dielectric layer 111 in a first direction, and external electrodes 131 and 132 disposed on the body 110.

In the body 110, the dielectric layer 111 and the internal electrodes 121 and 122 may be alternately stacked.

The body 110 may include a capacitance formation portion disposed therein, the capacitance formation portion forming capacitance including a first internal electrode 121 and a second internal electrode 122 disposed alternately with the dielectric layer 111 interposed therebetween.

A plurality of dielectric layers 111 included in the body 110 may be in a sintered state, and adjacent dielectric layers 111 may be integrated with each other such that boundaries therebetween are not readily apparent without using a scanning electron microscope (SEM).

Referring to the enlarged view of FIG. 5, the dielectric layer 111 may include a dielectric grain G therein, and polarizations in different directions may be formed within the dielectric grain G, such that a domain wall DW, a boundary therebetween, may be observed.

A method for measuring DC bias aging characteristics of a multilayer capacitor according to the present example embodiment may use a change in polarization and domain wall due to application of a poling voltage.

Specifically, the domain wall DW within the dielectric layer 111 may be expanded through an operation of applying a poling voltage to the multilayer capacitor 100 according to the present example embodiment. Thereafter, a size of the domain wall DW within the dielectric layer 111 may be contracted to a previous size thereof through an operation of applying a DC bias voltage, lower than the poling voltage, to the multilayer capacitor 100 according to the present example embodiment.

A raw material included in the dielectric layer 111 is not limited as long as sufficient capacitance is obtained therewith. In general, a perovskite ($ABO_3$)-based material may be used. In a chemical formula $ABO_3$, "A" may include one of barium (Ba), strontium (Sr), and calcium (Ca), and "B" may include one of titanium (Ti) and zirconium (Zr), but the present disclosure is not limited thereto.

The raw material included in the dielectric layer 111 may be a barium titanate-based material, a lead composite perovskite-based material, or a strontium titanate-based material. The barium titanate-based material may include $BaTiO_3$-based ceramic powder particles. Examples of the ceramic powder particles may include $(Ba_{1-x}Ca_x)TiO_3$ (0<x<1), $Ba(Ti_{1-y}Ca_y)O_3$ (0<y<1), $(Ba_{1-x}Ca_x)(Ti_{1-y}Zr_y)O_3$ (0<x<1, 0<y<1), or $Ba(Ti_{1-y}Zr_y)O_3$ (0<y<1) obtained by partially dissolving Ca or Zr in $BaTiO_3$.

In addition, the raw material included in the dielectric layer 111 may be obtained by adding various ceramic additives, organic solvents, binders, dispersants, and the like to powder particles such as barium titanate ($BaTiO_3$) depending on the purpose of the present disclosure.

Referring to FIGS. 2 and 3, the internal electrodes 121 and 122 may be stacked alternately with the dielectric layer 111.

The internal electrodes 121 and 122 may include the first internal electrode 121 and the second internal electrode 122, and the first and second internal electrodes 121 and 122 may be alternately disposed to oppose each other with the dielectric layer 111 included in the body 110 interposed therebetween, and may be exposed to third and fourth surfaces 3 and 4 of the body 110, respectively.

The first internal electrode 121 may be connected to the first external electrode 131 without being connected to the second external electrode 132, and the second internal electrode 122 may be connected to the second external electrode 132 without being connected to the first external electrode 131. In this case, the first and second internal electrodes 121 and 122 may be electrically isolated from each other by the dielectric layer 111 disposed therebetween.

The body 110 may be formed by alternately stacking a ceramic green sheet on which the first internal electrode 121 is printed and a ceramic green sheet on which the second internal electrode 122 are printed, and then performing sintering thereon.

A material included in the internal electrodes 121 and 122 is not particularly limited, and any material having excellent electrical conductivity may be used. For example, the internal electrodes 121 and 122 may include at least one of nickel (Ni), copper (Cu), palladium (Pd), silver (Ag), gold (Au), platinum (Pt), tin (Sn), tungsten (W), titanium (Ti), and alloys thereof.

Capacitance of the multilayer capacitor 100 may be proportional to an overlapping area between the first and second internal electrodes 121 and 122 in a stacking direction (a first direction), may be proportional to the total number of stacks of the first and second internal electrodes 121 and 122, and may be inversely proportional to a distance between the first and second internal electrodes 121 and 122.

As the distance between the first and second internal electrodes 121 and 122 decreases, the multilayer capacitor 100 may have a higher capacitance relative to a thickness thereof. Conversely, as the distance between the first and second internal electrodes 121 and 122 increases, the multilayer capacitor 100 may have a higher withstand voltage. Accordingly, the distance between the internal electrodes may be adjusted depending on specifications (for example, miniaturization and/or high capacitance required for a capacitor for an electronic device, high withstand voltage characteristics and/or excellent strength required for a capacitor for an electrical device, or the like), required by the multilayer capacitor 100.

The body 110 may include cover portions 112 and 113 disposed on both end-surfaces of the capacitance formation portion in the first direction.

More specifically, the body 110 may include an upper cover portion 112 disposed on an upper portion of the capacitance formation portion in the first direction, and a lower cover portion 113 disposed on a lower portion of the capacitance formation portion in the first direction.

The upper cover portion 112 and the lower cover portion 113 may be formed by respectively stacking a single dielectric layer 111 or two or more dielectric layers 111 on upper and lower surfaces of the capacitance formation portion in the first direction, and may basically serve to prevent damage to the internal electrodes 121 and 122 caused by physical or chemical stress.

The upper cover portion 112 and the lower cover portion 113 may not include the internal electrodes 121 and 122, and may include a material the same as that of the dielectric layer 111. That is, the upper cover portion 112 and the lower cover portion 113 may include a ceramic material, for example, a barium titanate ($BaTiO_3$)-based ceramic material.

The external electrodes 131 and 132 may be disposed on the body 110 and connected to the internal electrodes 121 and 122.

More specifically, the external electrodes 131 and 132 may be respectively disposed on the third and fourth surfaces 3 and 4 of the body 110, and may include first and second external electrodes 131 and 132 respectively connected to the first and second internal electrodes 121 and 122. That is, the first external electrode 131 may be disposed on the third surface 3 of the body and connected to the first internal electrode 121, and the second external electrode 132 may be disposed on the fourth surface 4 of the body and connected to the second internal electrode 122.

The external electrodes 131 and 132 may include any material having electrical conductivity, such as metal or the like. A specific material may be determined in consideration of electrical characteristics, structural stability, or the like. The external electrodes 131 and 132 may have a multilayer structure.

For example, the external electrodes 131 and 132 may include electrode layers 131*a* and 132*a* disposed on the body 110, and plating layers 131*b* and 132*b* disposed on the electrode layers 131*a* and 132*a*.

For more specific examples of the electrode layers 131*a* and 132*a*, the electrode layers 131*a* and 132*a* may be sintered electrodes including a conductive metal and glass, or may be resin-based electrodes including a conductive metal and a resin.

In addition, the electrode layers 131*a* and 132*a* may be formed by sequentially forming a sintered electrode and a resin-based electrode on the body 110.

In addition, the electrode layers 131*a* and 132*a* may be formed by transferring a sheet including a conductive metal onto the body 110, or by transferring a sheet including a conductive metal onto a sintered electrode.

The conductive metal used for the electrode layers 131*a* and 132*a* is not particularly limited as long as the conductive metal is a material electrically connectable to the internal electrodes 121 and 122 to form capacitance. For example, the conductive metal may include at least one selected from the group consisting of nickel (Ni), copper (Cu), palladium (Pd), silver (Ag), gold (Au), platinum (Pt), tin (Sn), tungsten (W), titanium (Ti), and alloys thereof. The electrode layers 131*a* and 132*a* may be formed by applying a conductive paste prepared by adding glass frit to the conductive metal powder particles, and then performing sintering thereon.

Figure 6:
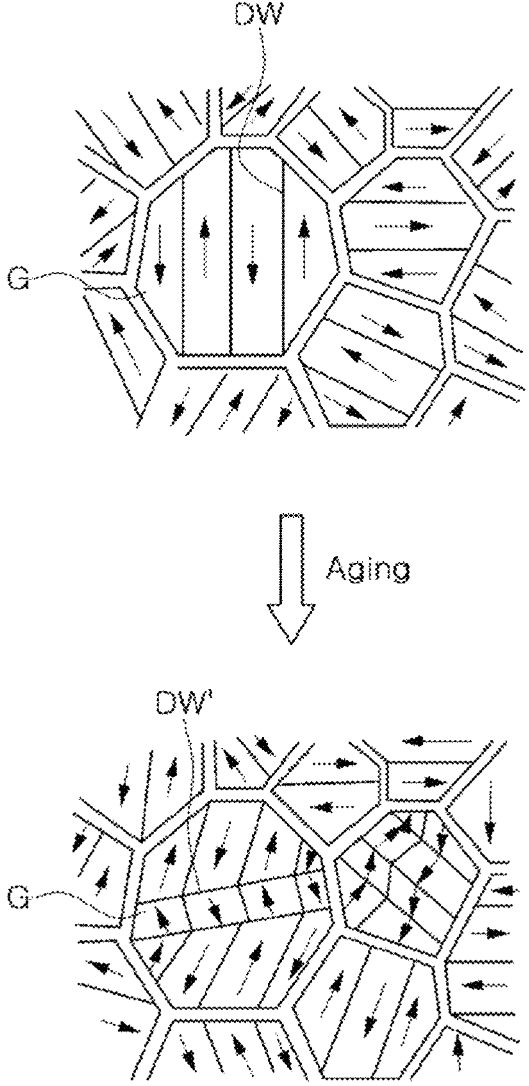
FIG. 6 is a schematic diagram illustrating a change in domain wall due to aging of a multilayer capacitor.

Measurement Principle and Experimental Results of DC Bias Aging Characteristics of Multilayer Capacitor FIG. 6 is a schematic diagram illustrating a change in domain wall due to aging of a multilayer capacitor.

Referring to FIG. 6, dielectric grains G of a multilayer capacitor 100 may form a domain wall DW by spontaneous polarization. After a long period of time at a temperature less than or equal to a Curie temperature (Tc) of a dielectric layer 111, a 180°-domain wall DW may be rearranged into a 90°-domain wall DW', a more stable form, resulting in a lower capacitance of the multilayer capacitor 100 due to a reduction in permittivity.

The present example embodiment may have a purpose to accurately predict saturated capacitance of the multilayer capacitor 100, decreasing after aging for a long period of time, and to use the predicted saturated capacitance as an assurance indicator, and may use a principle of applying a poling voltage higher than a DC bias voltage for a predetermined period of time in advance to expand the domain wall DW, and then re-applying the DC bias voltage to contract the domain wall DW such that the saturated capacitance is rapidly reached under the actual use environment of the multilayer capacitor 100.

Figure 7:
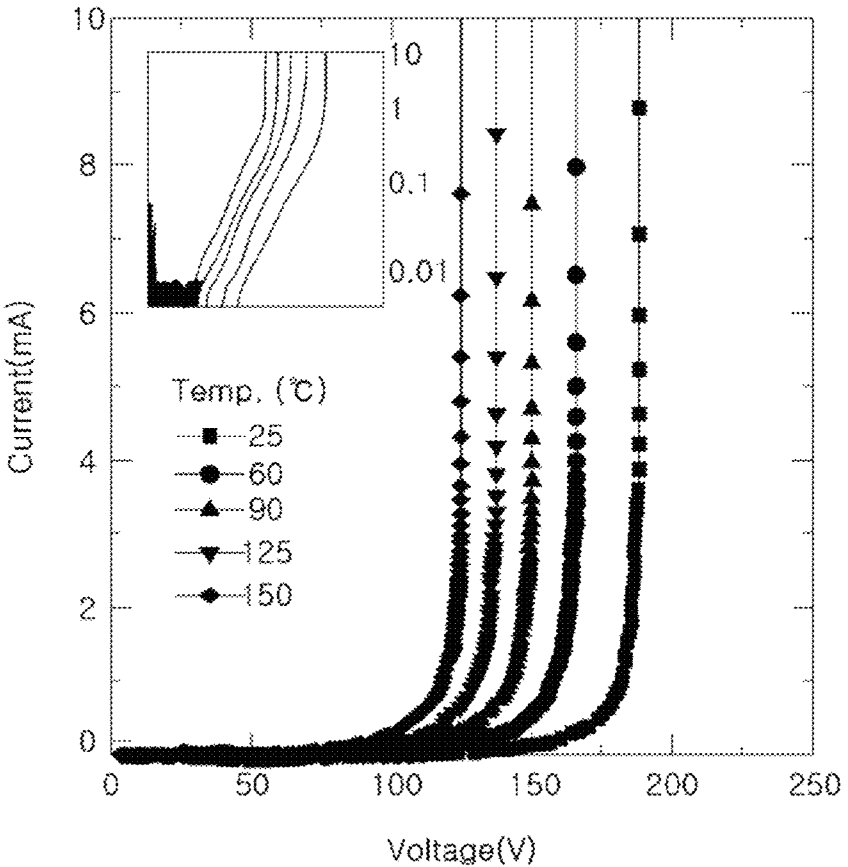
FIG. 7 is a graph illustrating a result of measuring voltage-current characteristics of a multilayer capacitor for each temperature.

FIG. 7 is a graph illustrating a result of measuring voltage-current characteristics of a multilayer capacitor for each temperature.

Referring to FIG. 7, when a DC voltage is applied to a multilayer capacitor at a specific temperature, in addition to aging characteristics under a high voltage or high temperature condition, variables, caused by mechanical defects, IR degradation, or oxygen vacancy, may occur. Accordingly, in the method for measuring DC bias aging characteristics of a multilayer capacitor according to the present example embodiment, a poling voltage and temperature range were appropriately controlled to focus on the aging characteristics.

For example, a poling voltage applied to a multilayer capacitor 100 was set to a DC voltage of less than 100 V, and a temperature was controlled to less than 180° C.

Figure 8A:
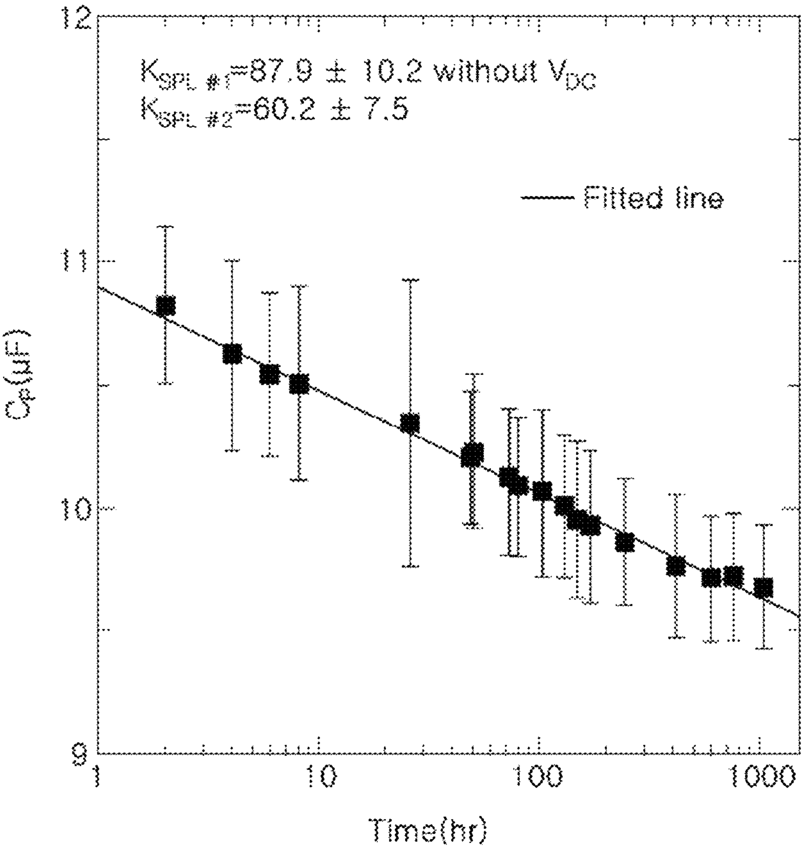
FIG. 8A is a graph illustrating a change in capacitance due to aging when a DC bias voltage is not applied to a multilayer capacitor.

FIG. 8A is a graph illustrating a change in capacitance due to aging when a DC bias voltage is not applied to a multilayer capacitor.

Referring to FIG. 8A, the capacitance of the multilayer capacitor when the DC bias voltage is not applied to the multilayer capacitor may be described using an exponential decay function with the following equation.

$$t = Ae^{-\frac{c_t - c_0}{k}} \quad \text{[Equation 1]}$$

Here, when an aging rate k is measured, a capacitance value for a specific period of time, generally 1000 hours to 2000 hours or less, may be used.

Figure 8B:
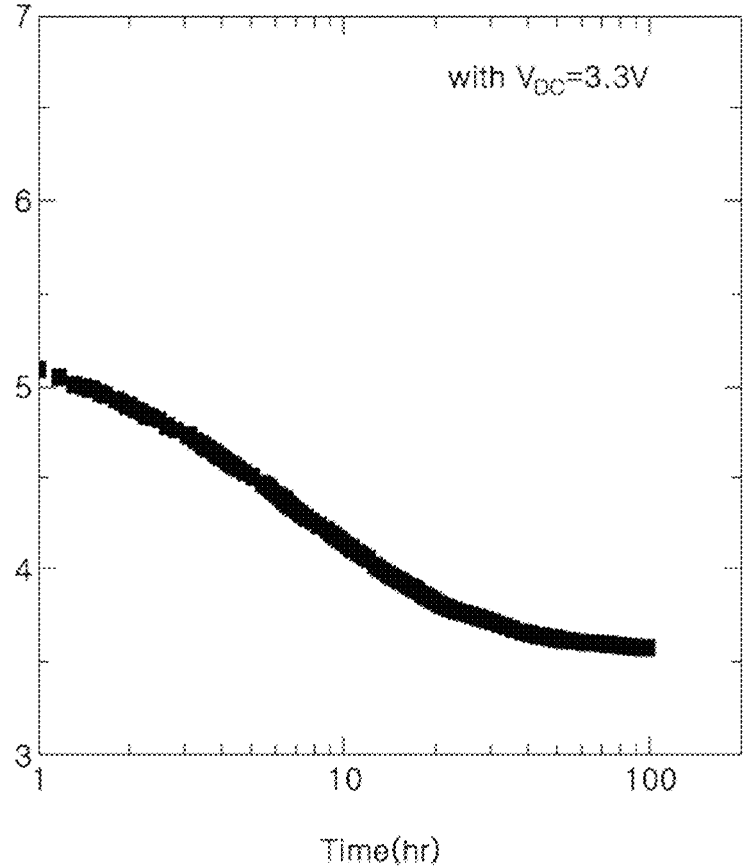
FIG. 8B is a graph illustrating a change in capacitance due to aging when a DC bias voltage is applied to a multilayer capacitor.

FIG. 8B is a graph illustrating a change in capacitance due to aging when a DC bias voltage is applied to a multilayer capacitor.

When comparing FIG. 8B with FIG. 8A, as a DC bias voltage of 3.3 V is applied to a multilayer capacitor 100, capacitance may deviate from exponential decay and may be saturated at a certain point in time.

Such a result may be presumed to be because domain walls DW within dielectric grains G of the multilayer capacitor 100 are continuously combined with each other due to application of a DC electric field or high temperature.

However, even when a period of time required for capacitance of the multilayer capacitor 100 to be saturated decreases due to application of a DC bias voltage or high temperature, 1000 hours or more may be required. Accordingly, in order to predict the saturated capacitance within a short period of time, it may be necessary to observe changes in aging characteristics related to a DC bias voltage and temperature.

FIGS. 9A to 9E are TEM images illustrating a microstructure of a domain wall according to a temperature of a multilayer capacitor.

Figure 9A:
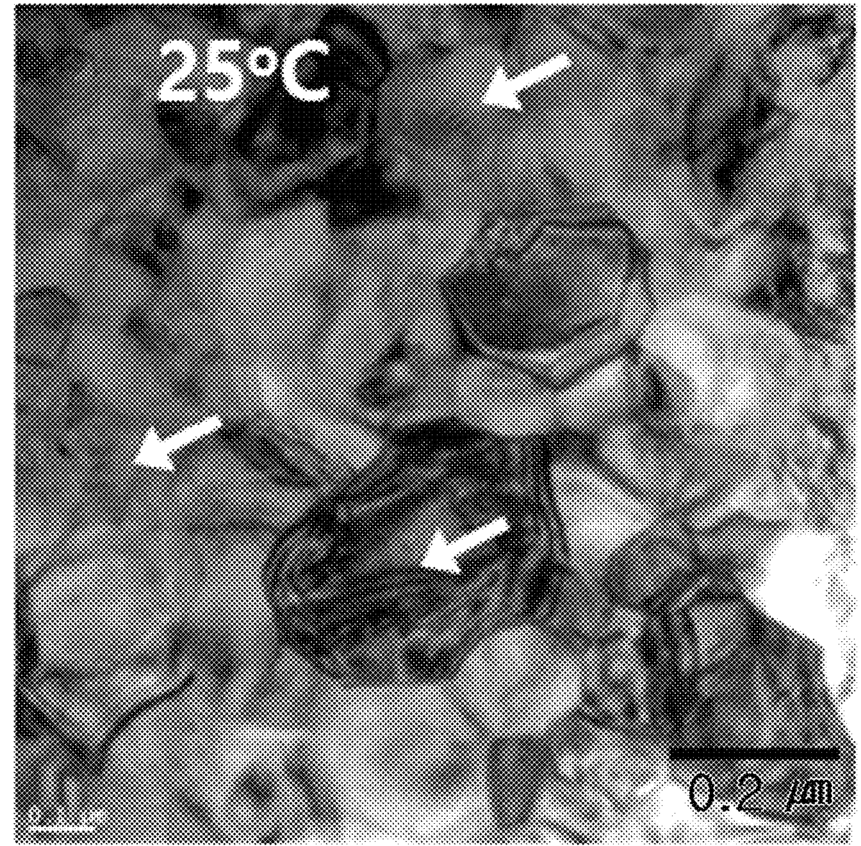
FIGS. 9A to 9E are TEM images illustrating a microstructure of a domain wall according to a temperature of a multilayer capacitor.
Figure 9B:
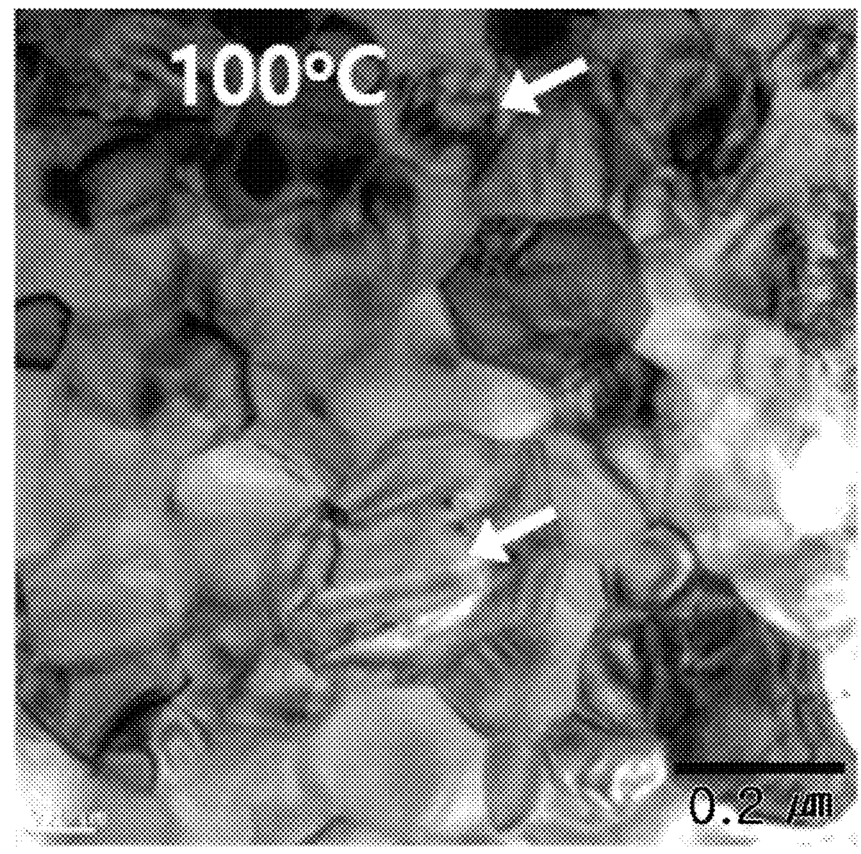
Figure 9C:
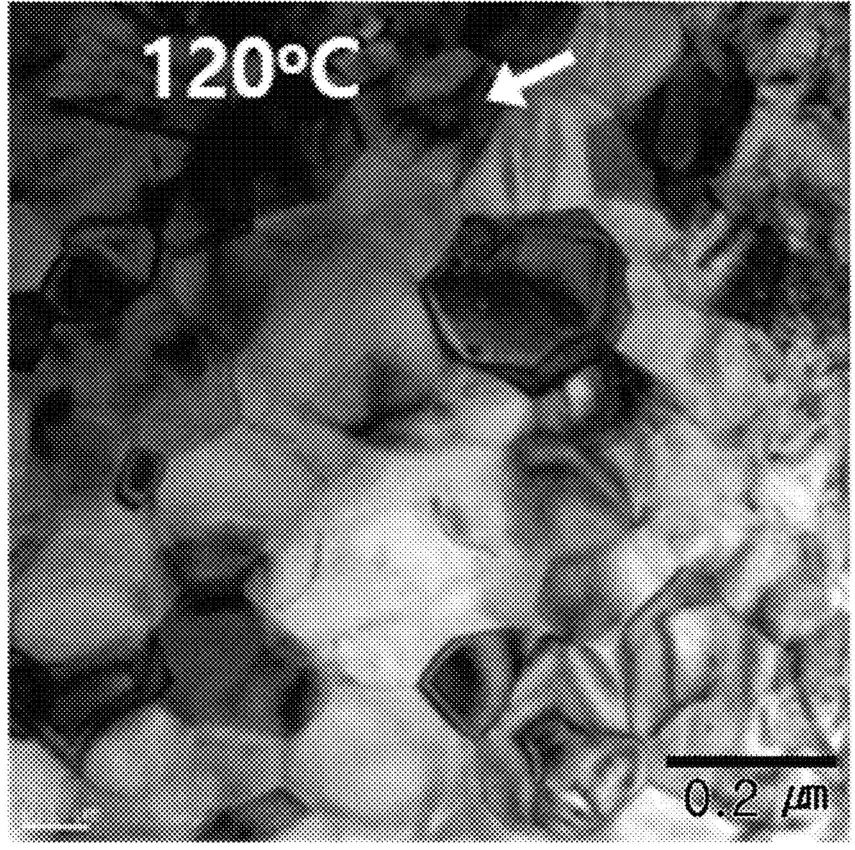
Figure 9D:
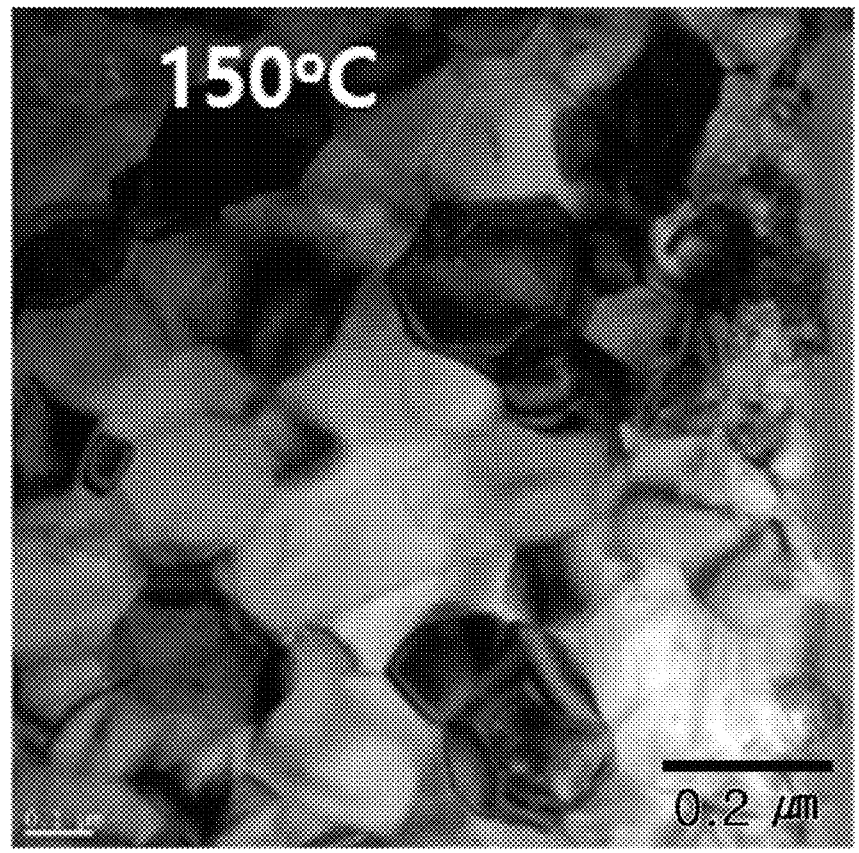
Figure 9E:
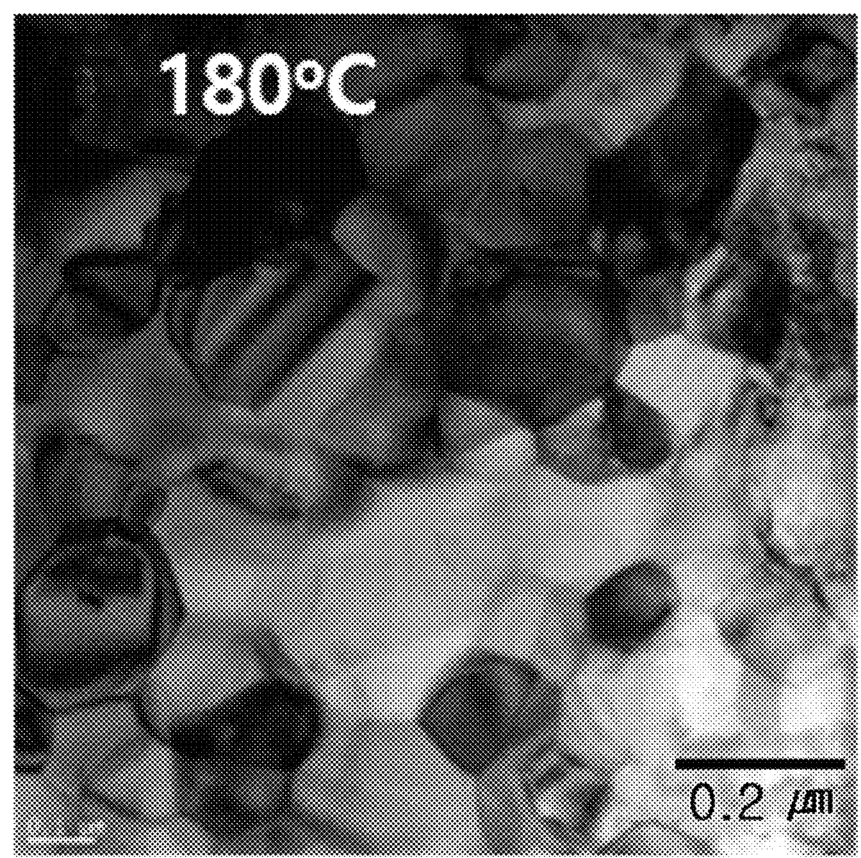

Referring to FIGS. 9A to 9E, shapes, such as objects indicated by the arrows of FIGS. 9A to 9C, may be domain walls. It was observed that the number of domain walls was reduced at a temperature higher than or equal to 100° C.

Such a phenomenon may be related to a phase transition of a barium titanate ($BaTiO_3$) crystal structure included in a dielectric layer from a tetrahedron to a cube. In the case of $BaTiO_3$-based perovskite oxide, a material included in a dielectric layer 111 of a multilayer capacitor 100 according to the present example embodiment, some domain walls were observed even at 180° C.

Figure 10:
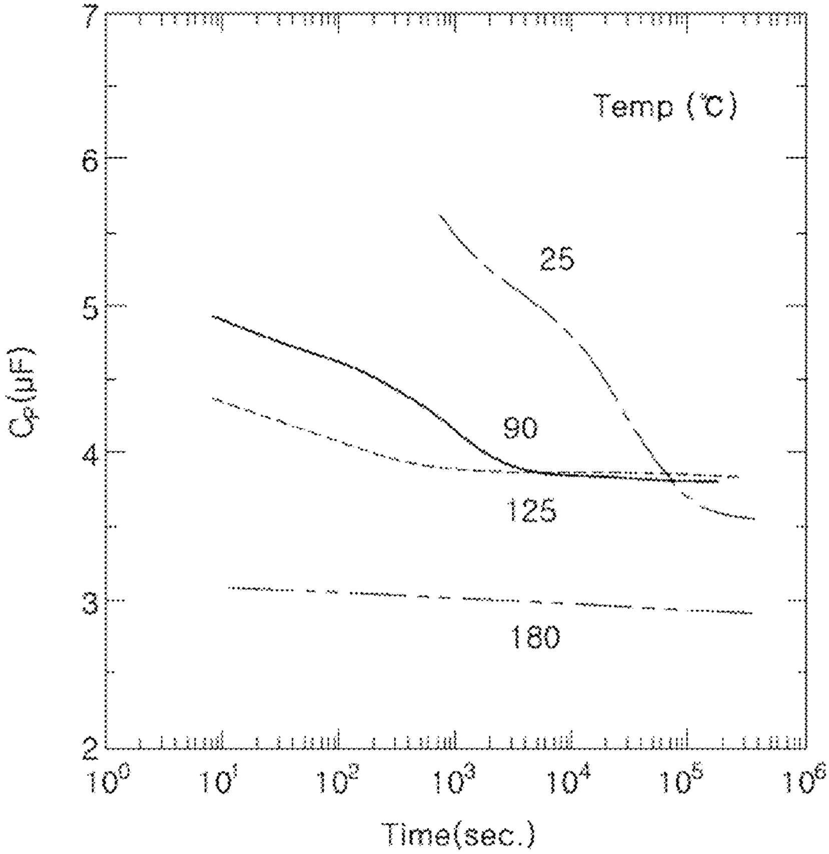
FIG. 10 is a graph illustrating a change in capacitance due to aging for each temperature when a DC bias voltage is applied to a multilayer capacitor.

FIG. 10 is a graph illustrating a change in capacitance due to aging for each temperature when a DC bias voltage is applied to a multilayer capacitor.

Referring to FIG. 10, the DC bias aging characteristics of the multilayer capacitor were measured under various temperature conditions from 25° C. to 180° C.

A point in time at which capacitance of the multilayer capacitor was saturated was measured for each temperature. At 180° C., saturation characteristics of the capacitance were different, as compared to remaining temperatures lower than 180° C. Accordingly, when measuring the DC bias aging characteristics of the multilayer capacitor according to the present example embodiment, 180° C. was excluded and experiments were conducted under lower temperature conditions.

Figure 11:
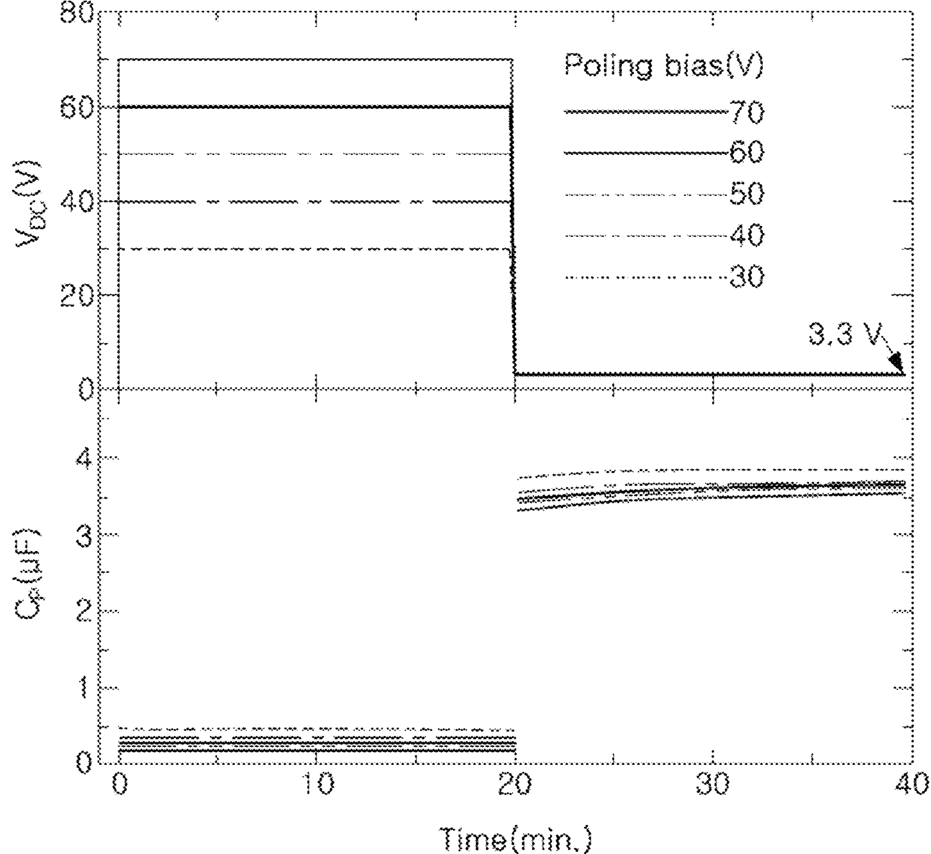
FIG. 11 is a graph illustrating capacitance of a multilayer capacitor when a poling voltage of 30 V to 70 V is applied to the multilayer capacitor at 25° C., and capacitance of the multilayer capacitor when a DC bias voltage of 3.3 V is applied.

FIG. 11 is a graph illustrating capacitance of a multilayer capacitor when a poling voltage of 30 V to 70 V is applied to the multilayer capacitor at 25° C., and capacitance of the multilayer capacitor when a DC bias voltage of 3.3 V is applied.

Referring to FIG. 11, when a poling voltage is applied to a multilayer capacitor 100, capacitance of the multilayer capacitor 100 had a small value of less than 1 μF. When a DC bias voltage of 3.3 V is applied immediately after maintaining the poling voltage for 20 minutes, it was observed that the capacitance of the multilayer capacitor 100 was rapidly saturated.

The experiment was conducted at 25° C. When a poling voltage of 30 V to 70 V was applied, the capacitance of the multilayer capacitor 100, a measurement target, was rapidly aged within a short period of time without IR degradation.

Thereafter, a voltage was lowered and a DC bias voltage of 3.3V was applied to measure the capacitance after depolarization, and it was observed that a saturation state was rapidly reached within about 1000 seconds.

Figure 12:
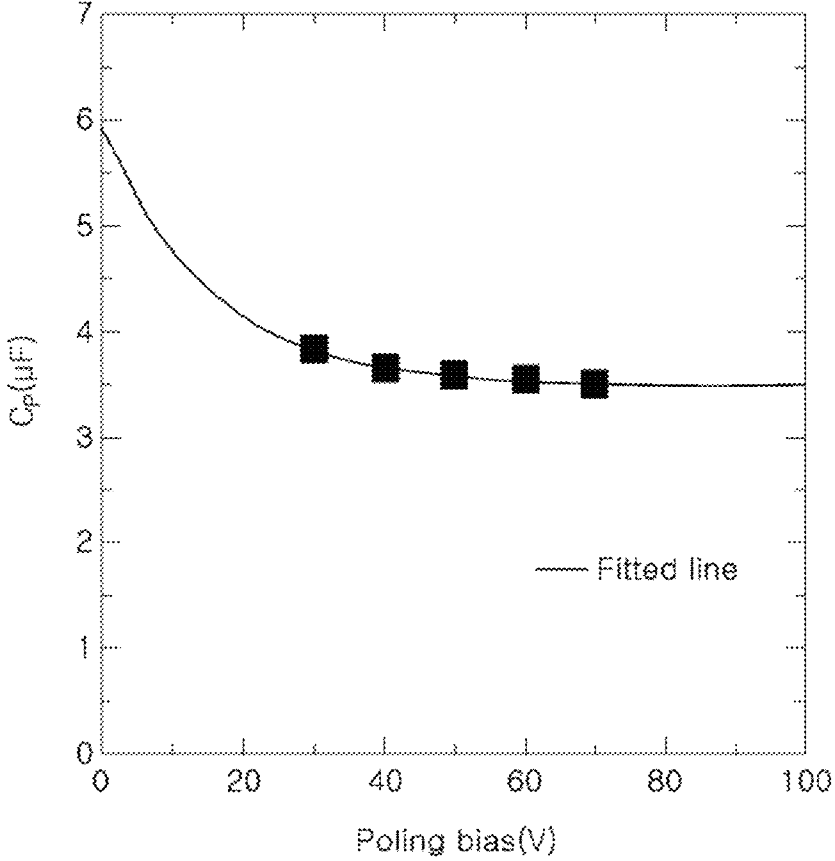
FIG. 12 is a graph illustrating a result of fitting a change in saturated capacitance of a multilayer capacitor due to a poling voltage with an exponential decay function.

FIG. 12 is a graph illustrating a result of fitting a change in saturated capacitance of a multilayer capacitor due to a poling voltage with an exponential decay function.

Referring to FIG. 12, FIG. 12 illustrates a result of fitting a measured value in FIG. 11 with an exponential decay function, and illustrates a measured value of saturated capacitance of the multilayer capacitor according to a poling voltage at a temperature of 25° C. From the graph, it can be seen that the saturated capacitance decreases as the poling voltage increases. The saturated capacitance may be predicted by fitting an exponential decay function, thereby measuring DC bias aging characteristics of the multilayer capacitor.

For example, immediately after a DC bias voltage of 3.3 V was applied to the multilayer capacitor having a capacitance of 9.19 μF, the multilayer capacitor had a capacitance of 5.66 μF. After the DC bias voltage of 3.3 V was applied for 100 hours, the multilayer capacitor had a capacitance of 3.58 μF.

In comparison, according to a method of measuring DC bias aging characteristics of a multilayer capacitor according to the present example embodiment, capacitance of the multilayer capacitor was saturated to 3.50 μF within 1000 seconds when a poling voltage of 40 V was applied for 20 minutes and then a DC bias voltage of 3.3 V was applied. Such a result may be an error rate of 2.23%, as compared to the above-described comparative example.

Accordingly, as compared to the capacitance measured after the DC bias voltage was applied for 100 hours as in the above-described comparative example, saturated capacitance of the multilayer capacitor may be measured with high accuracy within a short period of time of 1 hour or less.

Figure 13A:
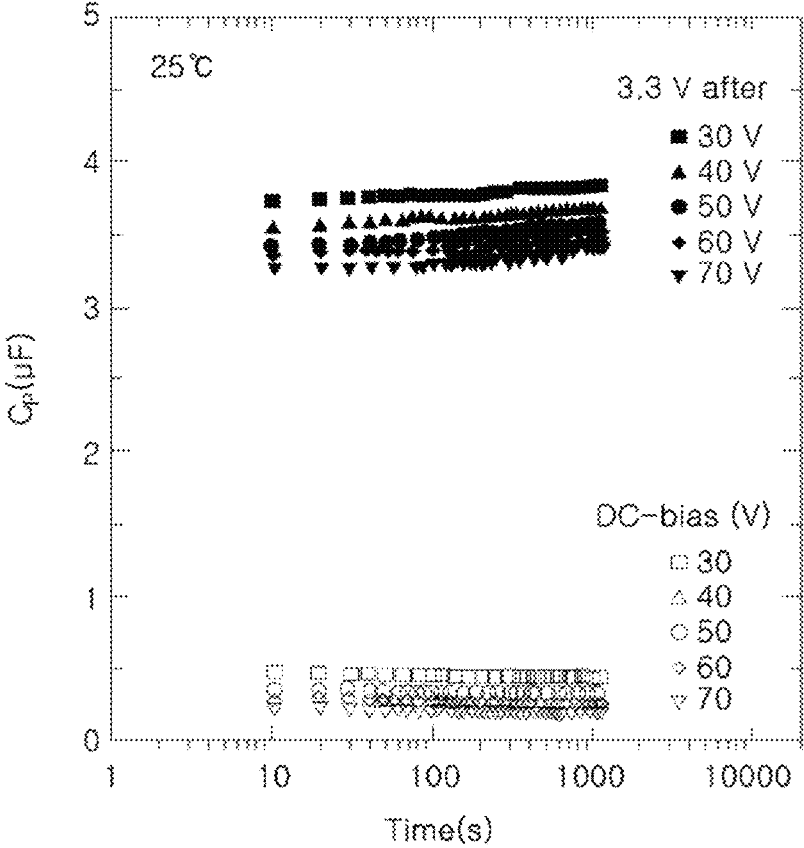
FIGS. 13A to 13C are graphs illustrating capacitance of a multilayer capacitor when a poling voltage of 30 V to 70 V is applied to the multilayer capacitor, and capacitance of the multilayer capacitor when a DC bias voltage of 3.3 V is applied to the multilayer capacitor, under various temperature conditions.
Figure 13B:
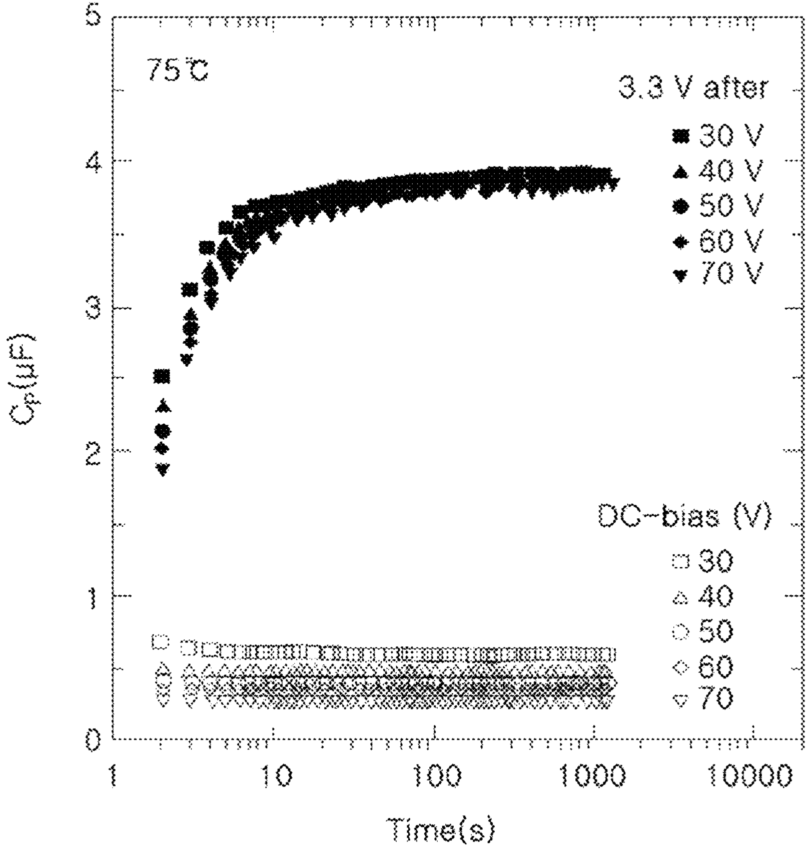
Figure 13C:
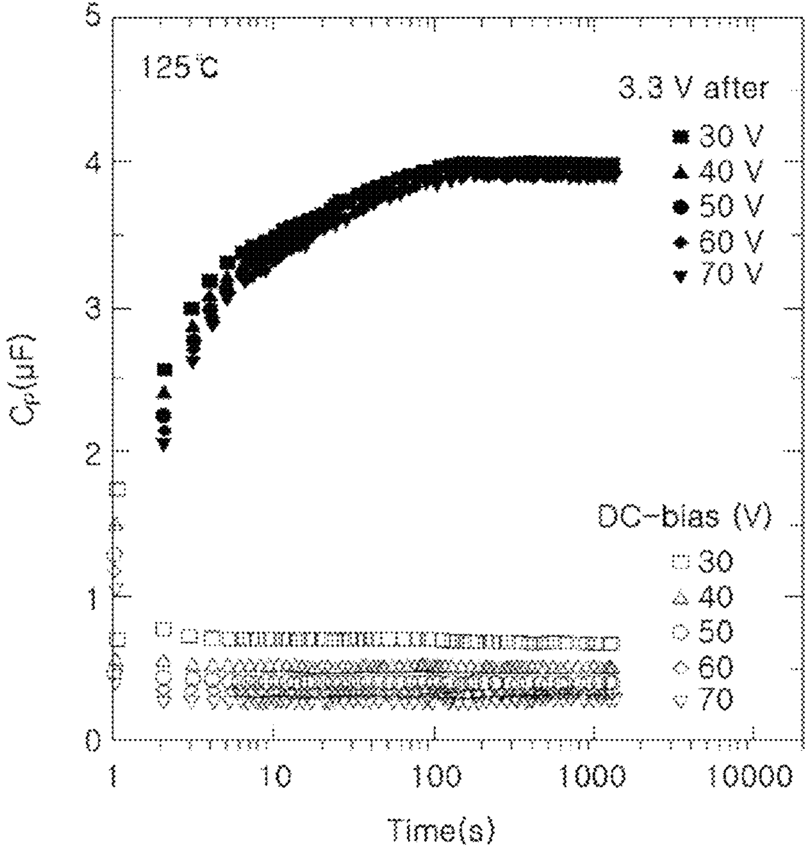

FIGS. 13A to 13C are graphs illustrating capacitance of a multilayer capacitor when a poling voltage of 30 V to 70 V is applied to the multilayer capacitor, and capacitance of the multilayer capacitor when a DC bias voltage of 3.3 V is applied to the multilayer capacitor, under various temperature conditions.

Referring to FIGS. 13A to 13C, it was observed that the capacitance of the multilayer capacitor was more rapidly saturated, as temperature increased to 25° C., 75° C., and 125° C. This may be because depolarization rapidly occurs due to application of a DC bias voltage is applied as temperature increases.

While example embodiments have been shown and described above, it will be apparent to those skilled in the art that modifications and variations could be made without departing from the scope of the present disclosure as defined by the appended claims.

What is claimed is:

1. A method for measuring DC bias aging characteristics of a multilayer capacitor, the method comprising:

applying a first poling voltage to the multilayer capacitor including a body having a dielectric layer including a plurality of dielectric grains and an internal electrode disposed alternately with the dielectric layer in a first direction, and an external electrode disposed on the body;

maintaining the first poling voltage for a first period of time (t1);

applying a DC bias voltage, lower than the first poling voltage, to the multilayer capacitor;

maintaining the DC bias voltage for a second period of time (t2); and measuring saturated capacitance of the multilayer capacitor, wherein the dielectric layer includes a perovskite-based material having a crystal structure represented by a chemical formula $ABO_3$.

2. The method of claim 1, further comprising:

applying a second poling voltage, different from the first poling voltage, to the multilayer capacitor;

maintaining the second poling voltage for the first period of time (t1);

applying the DC bias voltage, lower than the second poling voltage, to the multilayer capacitor;

maintaining the DC bias voltage for the second period of time (t2) for a second time; and measuring the saturated capacitance of the multilayer capacitor again.

3. The method of claim 2, further comprising:

predicting the saturated capacitance of the multilayer capacitor after DC bias aging, using the measured capacitance and an exponential decay function.

4. The method of claim 2, wherein the first poling voltage and the second poling voltage are 30 V or more and 70 V or less, respectively.

5. The method of claim 2, wherein the first poling voltage and the second poling voltage have a voltage difference of 10 V.

6. The method of claim 1, wherein the first poling voltage is lower than a breakdown voltage of the multilayer capacitor.

7. The method of claim 6, wherein the first poling voltage is 70% or less of the breakdown voltage of the multilayer capacitor.

8. The method of claim 1, wherein the DC bias voltage is 1.8 V or more and 3.3 V or less.

9. The method of claim 1, further comprising:

disposing the multilayer capacitor within a temperature control unit; and maintaining an internal temperature of the temperature control unit at a specific temperature.

10. The method of claim 9, wherein the specific temperature is equal to or less than a Curie temperature of the dielectric layer.

11. The method of claim 9, wherein the specific temperature is less than 180° C.

12. The method of claim 11, wherein the specific temperature is 25° C. or higher and 125° C. or lower.

13. The method of claim 1, wherein a domain wall within the dielectric layer is expanded through the applying the first poling voltage to the multilayer capacitor.

14. The method of claim 13, wherein the domain wall within the dielectric layer is contracted through the applying the DC bias voltage lower than the first poling voltage.

15. The method of claim 1, wherein, in the chemical formula $ABO_3$, "A" includes one of barium (Ba), strontium (Sr), and calcium (Ca).

16. The method of claim 1, wherein, in the chemical formula $ABO_3$, "B" includes one of titanium (Ti) and zirconium (Zr).

17. A method for measuring DC bias aging characteristics of a multilayer capacitor, the method comprising:

applying a first poling voltage to the multilayer capacitor including a body having a dielectric layer including a plurality of dielectric grains and an internal electrode disposed alternately with the dielectric layer in a first direction, and an external electrode disposed on the body:

maintaining the first poling voltage for a first period of time (t1);

applying a DC bias voltage, lower than the first poling voltage, to the multilayer capacitor;

maintaining the DC bias voltage for a second period of time (t2); and measuring saturated capacitance of the multilayer capacitor, wherein the first period of time (t1) and the second period of time (t2) are 1 minute or more, respectively.

18. The method of claim 17, wherein the first period of time (t1) is 20 minutes.

19. A method for measuring DC bias aging characteristics of a multilayer capacitor, the method comprising:

applying a first poling voltage to the multilayer capacitor including a body having a capacitance region in which at least one first internal electrode and at least one second internal electrode are alternately stacked in a first direction with at least one dielectric layer interposed therebetween, and first and second external electrodes disposed on the body to be spaced apart from each other, the first and second external electrodes respectively connected to the at least one first internal electrode and the at least one second internal electrode;

measuring a first capacitance of the multilayer capacitor to which a DC bias voltage, lower than the first poling voltage, is applied after the first poling voltage is applied;

applying a second poling voltage, different from the first poling voltage, to the multilayer capacitor;

measuring a second capacitance of the multilayer capacitor to which the DC bias voltage, lower than the second poling voltage, is applied after the second poling voltage is applied; and determining, based on the first and second poling voltages and the first and second capacitances, DC bias aging characteristics of the multilayer capacitor.

* * * * *